United States Patent
Mushkin

(10) Patent No.: US 10,587,365 B2
(45) Date of Patent: Mar. 10, 2020

(54) REPETITION SCHEME FOR FLEXIBLE BANDWIDTH UTILIZATION

(71) Applicant: Integrated Silicon Solution, (Cayman) Inc., Grand Cayman (KY)

(72) Inventor: Mordechai Mushkin, Nirit (IL)

(73) Assignee: Integrated Silicon Solutions, (Cayman) Inc., Grand Cayman (KY)

( * ) Notice: Subject to any disclaimer, the term of this patent is extended or adjusted under 35 U.S.C. 154(b) by 30 days.

(21) Appl. No.: 15/922,719

(22) Filed: Mar. 15, 2018

(65) Prior Publication Data

US 2018/0270018 A1    Sep. 20, 2018

Related U.S. Application Data

(60) Provisional application No. 62/472,614, filed on Mar. 17, 2017, provisional application No. 62/472,199, filed on Mar. 16, 2017.

(51) Int. Cl.
 H04L 1/00      (2006.01)
 H04L 5/00      (2006.01)
 H03M 13/11     (2006.01)

(52) U.S. Cl.
 CPC .......... H04L 1/0064 (2013.01); H04L 1/0006 (2013.01); H04L 5/0007 (2013.01); H03M 13/1174 (2013.01); H04L 1/0071 (2013.01)

(58) Field of Classification Search
 CPC ... H04L 1/0064; H04L 1/0006; H04L 1/0065; H04L 1/08; H04L 5/0007; H04L 5/0044; H04L 1/0071; H03M 13/2906; H03M 13/6356; H03M 13/1102; H03M 13/1174
 See application file for complete search history.

(56) References Cited

U.S. PATENT DOCUMENTS

| | | | |
|---|---|---|---|
| 8,335,228 B2 | 12/2012 | Franco et al. | |
| 8,537,796 B2* | 9/2013 | Kim ................ | H04L 1/0072 370/338 |
| 8,676,982 B2 | 3/2014 | Lurie et al. | |
| 8,750,300 B2 | 6/2014 | Aloush et al. | |
| 9,094,232 B2 | 7/2015 | Aloush | |

(Continued)

OTHER PUBLICATIONS

International Search Report and Written Opinion for Application No. PCT/IB2018/051759, dated Jun. 5, 2018, pp. 1-15.

(Continued)

Primary Examiner — Kyle Vallecillo
(74) Attorney, Agent, or Firm — Patent Law Works LLP

(57) ABSTRACT

A network device implements a repetition scheme to generate a repetition-encoded FEC codeword for a FEC codeword. The repetition-encoded FEC codeword includes a set of bit sequences concatenated together. The set of bit sequences corresponds to a set of OFDM symbols. In some embodiments, each bit sequence is formed by M replicas of the FEC codeword and an offset is applied to shift the bit sequence where the offset is different for each bit sequence. In one embodiment, a right cyclic shift is used to offset the bits in each symbol. Each shifted bit sequence is allocated into subcarriers of an OFDM symbol over a frequency range indicative of an operating frequency band of a domain to form the respective OFDM symbol. The set of OFDM symbols is transformed into a time domain signal for transmission.

20 Claims, 9 Drawing Sheets

(56) References Cited

U.S. PATENT DOCUMENTS

| | | |
|---|---|---|
| 9,479,221 B2 | 10/2016 | Reuven |
| 2004/0151109 A1 | 8/2004 | Batra et al. |
| 2007/0201398 A1* | 8/2007 | Yang ............... H04B 7/2615 370/329 |
| 2009/0100310 A1 | 4/2009 | Yoo et al. |
| 2009/0276671 A1* | 11/2009 | Fang ............... H04L 1/0068 714/748 |
| 2011/0080963 A1* | 4/2011 | Kim ............... H04L 1/0072 375/260 |
| 2013/0254618 A1 | 9/2013 | Oksman et al. |
| 2014/0119473 A1* | 5/2014 | Breiling ........... H04L 1/0071 375/295 |
| 2014/0153625 A1* | 6/2014 | Vojcic ............. H04L 1/005 375/224 |

OTHER PUBLICATIONS

Vladimir Oksman, "G.hn: The New ITU-T Home Networking Standard", IEEE Communications Magazine, Oct. 2009, pp. 138-145.

\* cited by examiner

REPETITION SCHEME FOR FLEXIBLE BANDWIDTH UTILIZATION

CROSS REFERENCE TO RELATED APPLICATIONS

This application claims priority to U.S. Provisional Patent Application No. 62/472,199, entitled REPETITION SCHEME FOR FLEXIBLE BANDWIDTH UTILIZATION, filed Mar. 16, 2017, and U.S. Provisional Patent Application No. 62/472,614, entitled REPETITION SCHEME FOR FLEXIBLE BANDWIDTH UTILIZATION, filed Mar. 17, 2017, which are incorporated herein by reference for all purposes.

FIELD OF THE INVENTION

The invention relates to data networks generally and, in particular, to a repetition scheme implemented in a data network.

BACKGROUND OF THE INVENTION

A data network, is a digital telecommunications network which allows nodes to share resources. In data networks, devices or nodes exchange data with each other using connections between nodes (data links). These data links are established over cable media such as wires or optic cables, or wireless media such as WiFi. Network devices that originate, route and terminate the data are called network nodes. Nodes can include hosts such as personal computers, phones, servers as well as networking hardware.

Data networks typically implement some sort of media access scheme to prevent collision between multiple network nodes using the same communication line and to ensure quality of service. For example, some data networks, such as HPNA (Home Phoneline Network Alliance) v.3, HomePlug AV and G.hn networks, implement resource reservation schemes to allocate and guarantee media resources to network nodes communicating over a shared medium. In some examples, media access plans (MAP) are used where each MAP indicates when each device or node may access the shared medium. Media access plans are transmitted regularly to the devices in the network by a central coordinator, sometimes referred to as the domain master.

Home networking technologies have been developed to enable Ethernet connections in a residence without requiring the house to be wired with Cat-5 cable. While wireless local area networks (WLANs) based on the IEEE 802.11 standard have gained widespread adoption, WLANs suffers from performance limitations, such as poor radio frequency propagation and interference, especially in multiple dwelling units, which limit WLANs' ability to provide high-speed services with strict quality of service (QoS) requirements for applications such as high definition video streaming. As a result, developments have turned to wired in-home networking technologies, operating over all types of in-home wiring, such as telephone wiring, in-home power lines, coaxial cables, and Cat-5 cables. For example, G.hn is a specification for high-speed wired home networking with data rates up to 2 Gbit/s and with operation over four legacy in-home wiring, including telephone wiring, in-home power lines, coaxial cables and plastic optical fiber (POF). A G.hn network consists of one or more domains where each domain includes a domain master and up to 250 nodes. Benefits of a multi-wire standard such as the G.hn standard include lower equipment cost and lower deployment cost by allowing easy user self-install.

BRIEF DESCRIPTION OF THE DRAWINGS

Various embodiments of the invention are disclosed in the following detailed description and the accompanying drawings.

DETAILED DESCRIPTION

Figure 1:
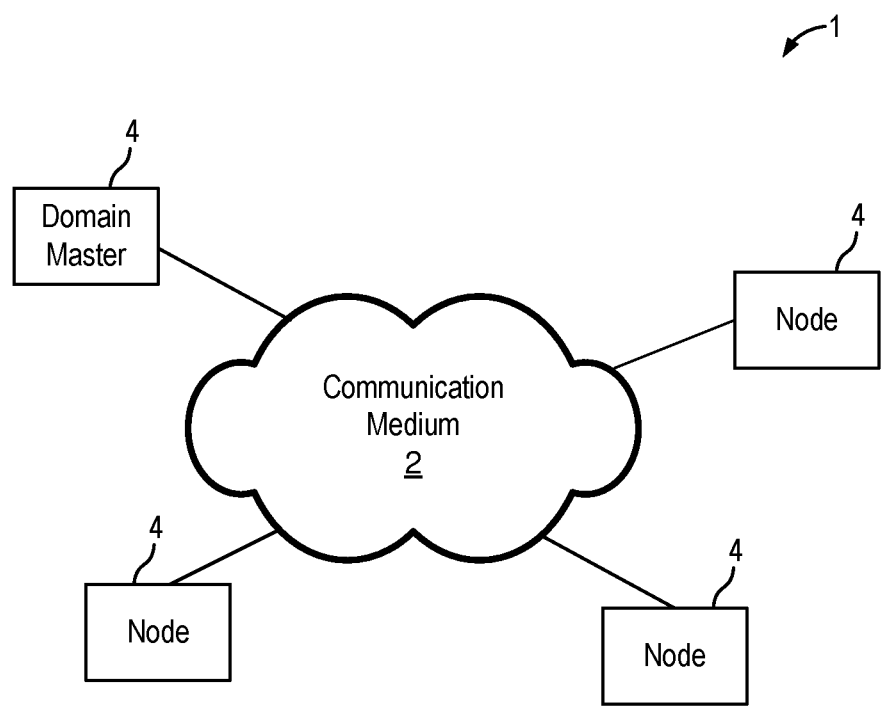
FIG. 1 illustrates a schematic diagram of a communication domain in which the repetition scheme of the present invention can be implemented in some embodiments.

The invention can be implemented in numerous ways, including as a process; an apparatus; a system; a composition of matter; a computer program product embodied on a computer readable storage medium; and/or a processor, such as a hardware processor or a processor device configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

According to embodiments of the present invention, a network device implements a repetition scheme to generate an encoded payload block including one or more repetition-encoded forward error correction (FEC) codewords. In some embodiments, each repetition-encoded FEC codeword is a set of bit sequences concatenated together. The set of bit sequences corresponds to a set of orthogonal frequency-division multiplexing (OFDM) symbols. In some embodiments, each bit sequence is formed by M replicas of the FEC codeword and an offset applied to shift the bit sequence where the offset is different for each bit sequence. In one embodiment, a right cyclic shift is used to offset the bits in each symbol. Each bit sequence with the respective offset is allocated into subcarriers of an OFDM symbol over a frequency range indicative of an operating frequency band of a domain to form the respective OFDM symbol.

The network device transmits a time domain signal representing the set of OFDM symbols corresponding to the repetition-encoded FEC codeword. In some cases, the network device has a transmit band bandwidth that is only a part of the entire communication bandwidth capability of the network domain in which the network device is coupled. In that case, the network device transmits a time domain signal associated with subcarriers in the transmit frequency band of the transmitter even though the bits of the repetition-encoded FEC codeword are allocated into subcarriers of the entire operating frequency of the domain.

In embodiments of the present invention, the network device transmitting message containing the set of OFDM symbols is a first network device in the network domain and a second network device in the same domain receives the transmitted message. The second network device may have a receive band bandwidth that is only a part of the entire communication bandwidth capability of the network domain. Furthermore, the second network device may have a receive band that overlaps with the transmit band of the first network device sending the message. The second network device receives the message in the overlap band of the receive band and decodes the message by decoding bits in the subcarriers in the overlap band.

In this manner, the network device may transmit a broadcast message to all network nodes in the domain without actually knowing the specific bandwidth associated with each individual node. Each individual node receives and decodes the broadcast message in its respective receive band bandwidth. A broadcast message can be successfully exchanged between nodes in a domain without each node having to know of receive bandwidth information of all the other nodes in the domain.

In embodiments of the present invention, the repetition scheme is implemented in a network device configured to operate in a home networking environment. In one embodiment, the repetition scheme is implemented in a network device configured to operate in a home network under the G.hn standard.

FIG. 1 illustrates a schematic diagram of a communication domain in which the repetition scheme of the present invention can be implemented in some embodiments. As used herein, a data network may include one or more communication domains. A communication domain (referred hereinafter as "domain") 1 is formed by all nodes 4 that utilize the same shared communication medium 2 for direct communicate with other nodes 4. FIG. 1 illustrates a representative domain model. In some cases, all nodes in the domain can communicate with each other. However, in some other cases, there might be some nodes in domain that are not able to communicate with certain other nodes in the same domain, a phenomenon which is sometimes referred to as hidden node phenomenon.

One of the nodes 4 in each domain 1 is designated as the domain master (DM) which controls the operation of the nodes in the domain, such as registration and admission of new nodes to the domain, bandwidth reservation and other management operations. To avoid interference between nodes on the shared medium, the domain master may coordinate the transmission times for the nodes under a given media access control scheme. For example, the domain master can create a media access plan (MAP) which is shared with the nodes in the domain at regular intervals. The media access plan specifies the transmission opportunities for each node to access the shared medium. In one example, in a G.hn network, synchronized media access is implemented where data transmission onto the shared medium by the nodes is coordinated by the domain master and synchronized with the media access control (MAC) cycle.

Nodes 4, also referred to as network nodes or communication nodes, in domain 1 operate under the same networking protocol to exchange data with each other over the communication medium 2. In some examples, the nodes 4 include computing devices or network devices, such as computers, tablets, mobile phones and other portable computing devices. The nodes 4 can also include network devices such as router, switches and gateways. In many cases, the communication node is a separated device, such as a modem, which are configured to be connected (e.g. via Ethernet) to a host (e.g. a computer or a TV set or other devices). In the case the domain 1 is a home network, nodes 4 can be network devices such as residential gateways or set-top boxes. In other examples, nodes 4 can be home automation devices, smart home devices or home security devices.

In some examples, the shared communication medium 2 (or "medium") can be a wireline medium, such as telephone wiring, in-home power lines, coaxial cables and plastic optical fiber (POF). In other examples, the shared communication medium 2 can be a wireless communication channel.

The domain 1 can be configured to operate under any suitable networking standard. In one embodiment, the domain 1 is configured to operate under the G.hn home networking standard. The G.hn standard specifies a single physical layer based on fast Fourier transform (FFT) orthogonal frequency-division multiplexing (OFDM) modulation and low-density parity-check code (LDPC) as the forward error correction (FEC) code. OFDM modulation systems split the transmitted signal into multiple orthogonal subcarriers. Under the G.hn standard, each one of the sub-carriers is modulated using quadrature amplitude modulation (QAM). The G.hn standard implement media access control based on a time division multiple access (TDMA) architecture, in which the domain master schedules transmission opportunities (TXOPs) that can be used by the nodes in the domain. For example, the domain master provides transmission opportunities to the nodes in a media access plan (MAP) that is broadcast to all nodes in regular intervals.

Under the G.hn home networking standard, the domain master may control the registration and admission of new nodes to the domain. The domain master may also control the utilization of the medium by the nodes of the domain. The domain master may transmit control frames, such as the MAP-A messages specified in the G.hn standard or other control messages, which are intended to be received, directly or indirectly, by the nodes of the domain. Additionally, or alternatively, the domain master may transmit control frames, such as the MAP-D messages specified in the G.hn standard, which are intended to be received, directly or indirectly, by new nodes wishing to register to the domain. A node which is not a domain master may be referred to as an end-node.

The data network or domain of FIG. 1 may support three major types of transmissions: unicast, multicast and broadcast. Unicast transmissions are direct transmissions between two nodes of the domain, such as when one node is downloading data from another. Multicast transmissions are transmissions from one node to a few of the other nodes in the domain, such as when multiple "clients" request to receive regular reports from a "source" (e.g. clients to a news feed). Broadcast transmissions are transmissions from one node to all the other nodes in the domain, such as network control information from the domain master to all the other nodes. In any given domain, all the nodes share the same communication medium but not all nodes need to communicate with all other nodes. In most cases, some of the nodes in a domain communicate with some other nodes.

Figure 2:
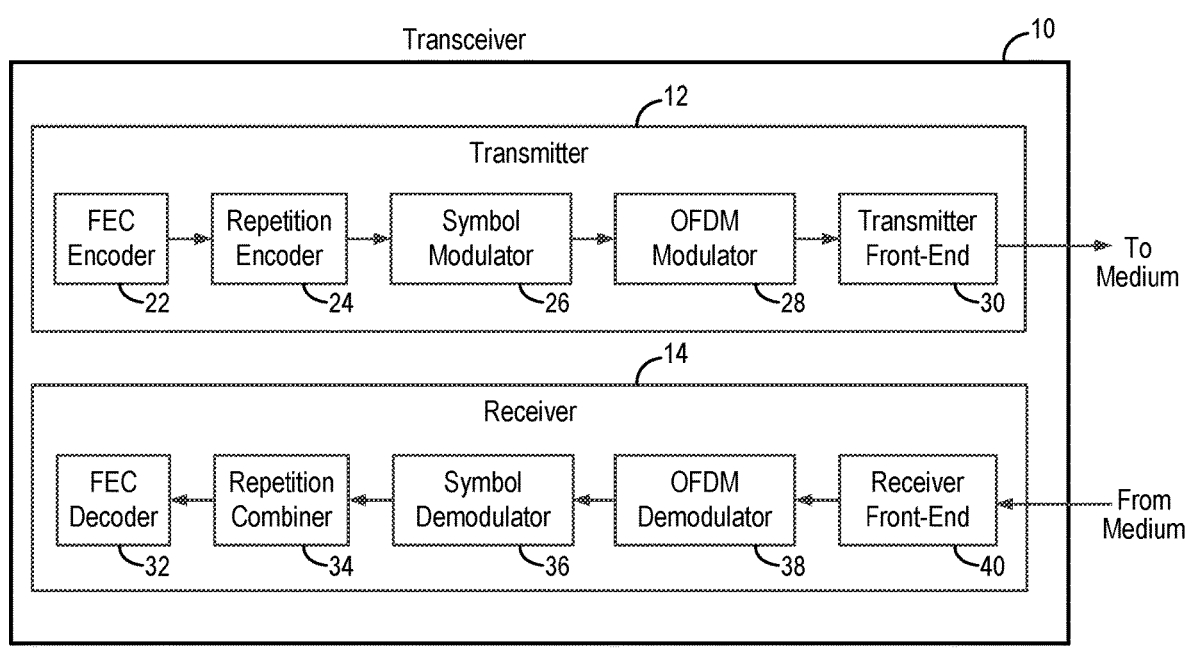
FIG. 2 is a schematic diagram of a communication node which can be used in the domain of FIG. 1 in some examples.

FIG. 2 is a schematic diagram of a communication node which can be used in the domain of FIG. 1 in some examples. In one embodiment, the node may be configured to operate according to the G.hn standard. In other embodiments, the node may be configured to operate under other suitable networking standard. Referring to FIG. 2, a node 10 is illustrated as a transceiver device to transmit data onto the shared medium and to receive data from the shared medium. The node (or transceiver) 10 includes a transmitter 12, which may also be referred herein as the transmission path, and a receiver 14, which may also be referred herein as the reception path. In the present embodiment, the transmitter 12 includes a FEC encoder 22, a repetition encoder 24, a symbol modulator 26, an OFDM modulator 28, and a transmitter front-end 30. The transmitter 12 receives the incoming payload data frame and generate encoded payload block for transmission onto the shared medium. In the present embodiment, the receiver 14 includes a receiver front-end 40, an OFDM demodulator 38, a symbol demodulator 36, a repetition combiner 34, and a FEC decoder 32. In some cases, the symbol modulator and demodulator may also be referred to as mapper and de-mapper, respectively.

In one example of the transmitter 12, the FEC encoder 22 is a block FEC encoder, such as an LDPC encoder, or any other suitable encoder. The FEC encoder 22 receives the incoming payload data frame indicative of data to be transmitted onto the shared medium and generates FEC codewords as output. The FEC codeword is also referred to as "FEC codeword block" or "FEC block" in the present description. The number of encoded bits in each FEC codeword produced by the FEC encoder 22 is denoted as $N_{FEC}$ bits. The repetition encoder 24 receives the FEC codewords from the FEC encoder 22 and generates repetition-encoded FEC codewords, as will be explained in more details below. A repetition-encoded FEC codeword may be represented as a block of bits or encoded bits.

The symbol modulator 26 maps the encoded bits produced by the repetition encoder 24 into complex symbols. The symbol modulator 26 may be a QAM modulator, or any other suitable modulator. The symbol modulator 26 arranges the bits of a repetition-encoded FEC codeword into groups of bits, and modulates each group of bits into a complex symbol, such as a complex QAM symbol. The OFDM modulator 28 receives the complex symbols produced by the symbol modulator 26, groups them into frequency domain OFDM symbols, wherein each complex symbol corresponds to a subcarrier of the OFDM symbol, and transforms each frequency domain OFDM symbol into a time domain OFDM symbol, wherein each complex symbol within the frequency domain OFDM symbol modulates a respective subcarrier of the time domain OFDM symbol.

The transmitter front-end 30 concatenates the time domain OFDM symbols into a continuous time domain signal and transmit the continuous time domain signal over the communication media. For example, at the transmitter front-end 30, successive complex symbols within the frequency domain OFDM symbols are transformed into successive subcarriers within the portion of the electro-magnetic spectrum or transmit frequency band (TX band) utilized by the transmitter.

In one example of the receiver 14, the receiver front-end 40 receives incoming signal from the communication medium and segments it into time-domain OFDM symbols. The OFDM demodulator 38 transforms each received time domain OFDM symbol into a frequency domain OFDM symbol comprising complex symbols. The symbol demodulator 36 demodulates the received complex symbols and produces soft-bits corresponding to the respective bits of the repetition-encoded bits. In some example, every soft-bits may be represented as a log-likelihood ratio (LLR). The repetition combiner 34 combines soft-bits produced by the symbol demodulator into combined soft-bits corresponding to respective encoded bits, wherein a set of soft-bits corresponding to repetitions of a given encoded bit are combined into a combined soft-bit corresponding to the given encoded bit. In some example, the repetition combiner may combine LLRs corresponding to repetitions of a given encoded bit by summing them up. The FEC decoder 32 decodes the combined soft bits to recover the payload data.

The transmitter 12 of node 10 includes the repetition encoder 24 implementing a repetition scheme in accordance with embodiments of the present invention to replicate the FEC codeword. The repetition encoder receives a FEC codeword from the FEC encoder 22 and generates a repetition-encoded FEC codeword including replicas of the original FEC codeword. As will be explained in more detail below, the repetition encoder 24 generates one or more replicas of the FEC block, applies offset to the replicas, and delivers the bits of the one or more replicas to the symbol modulator 26. The bits delivered to the symbol modulator 26 are modulated into complex symbols, which are then transformed by the OFDM modulator into subcarriers of the OFDM symbols.

With the transmitter 12 being provided with a repetition encoder 24, the receiver 14 is provided with a repetition combiner 34. The repetition combiner 34 operates in reverse to the repetition encoder 24 to receive soft-bits from symbol demodulator 36 and to combine the soft bits to generate the combined soft bits, which are then provided to the FEC decoder 32 to be decoded to recover the payload data.

The operation of the repetition scheme to generate repetition-encoded FEC codewords will be described in more detail below. In the present description, the repetition scheme is also referred to as the "codeword repetition scheme" or "codeword repetition method."

In the present description, a frequency band refers to a portion of the electro-magnetic spectrum, which can include the radio spectrum or the optical spectrum. The range of frequencies within a frequency band is referred to as the bandwidth. In a data network, such as the domain 1 shown in FIG. 1, nodes exchange data within a pre-defined or designated frequency band. In many cases, all the nodes of the domain are configured to operate over the same frequency band. However, in some cases, different nodes in the same domain may be configured to operate over different frequency bands.

For example, in some data networks, the domain may have a given domain frequency band but some nodes in the domain may operate only over a portion of the entire bandwidth of the domain. One reason for providing network devices with limited bandwidth is cost reduction. For example, a smart home light switch device may be made to communicate only over a small portion of the domain's entire bandwidth as the light switch device only need to exchange small amount of data sporadically. Another reason for providing network devices with limited bandwidth is geographical limitations. A frequency band may be blocked in some geographic regions but allowed in other geographic regions. The emerging G.hn standard 2.0 addresses the cases where a domain includes nodes that operate only on a portion of the entire bandwidth of the domain.

Figure 3:
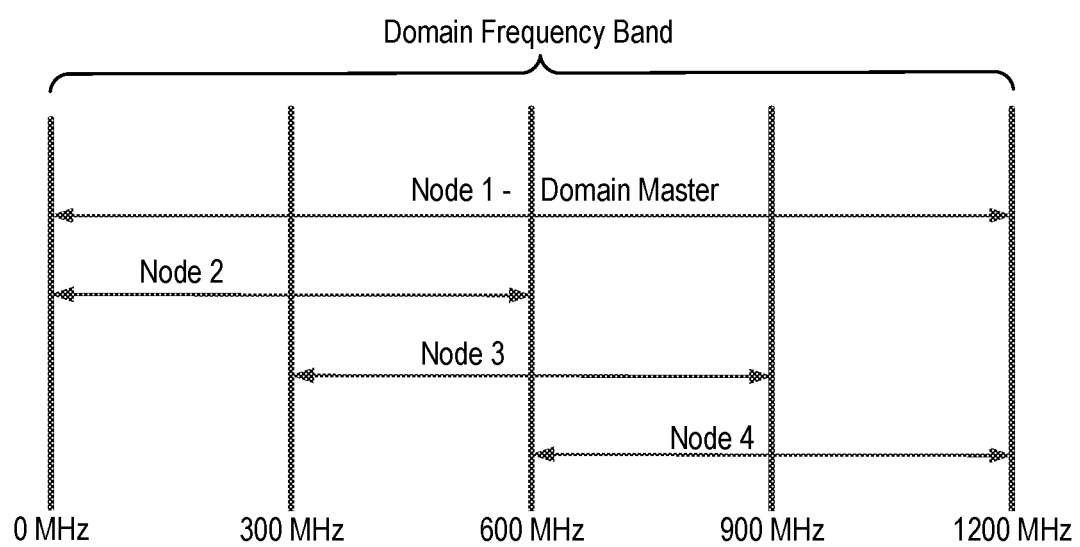
FIG. 3 illustrates the frequency band of a domain and the operational bandwidth of nodes in the domain in some examples.

FIG. 3 illustrates the frequency band of a domain and the operational bandwidth of nodes in the domain in some examples. Referring to FIG. 3, the domain has a frequency band from 0 to 1200 MHz. Node 1, which is the domain master, operates over the entire bandwidth of the domain. That is, Node 1 has a frequency band of 0 to 1200 MHz. Meanwhile, Node 2 has an operational frequency band of 0 to 600 MHz, Node 3 has an operational frequency band of 300 to 900 MHz, and Node 4 has an operational frequency band of 600 to 1200 MHz.

As thus configured, Nodes 1-4 within the domain of FIG. 3 may communicate only over the overlapping frequency band. For example, Node 1, the domain master, may communicate with all of the nodes in the domain as Node 1 transmits over the entire bandwidth of the domain. Meanwhile, Node 2 can communicate with Node 3 over the overlapping band of 300 to 600 MHz. Meanwhile, Node 2 cannot communicate with Node 4 directly because there is no overlapping band. Node 2 may communicate with Node 4 by relaying the message through Node 1 or Node 3.

In a unicast transmission between nodes of the domain, a source node sends transmissions intended to be received by one specific destination node. In the domain illustrated in FIG. 3, unicast transmissions from Node 2 to Node 3, and vice versa, can take place over the overlapping band of 300 to 600 MHz, and unicast transmissions from Node 3 to Node 4, and vice versa, can take place over the overlapping band of 600 to 900 MHz. In a unicast transmission, the overlapping band is known both to the source transmitter and the destination receiver. The nodes may learn of each other's capabilities, such as by virtue of the registration process with the domain master when the nodes are added to the domain. Therefore, in unicast transmissions, the transmitter may allocate the encoded bit to the subcarriers corresponding to the overlapping band, and the receiver may obtain the respective Log-Likelihood Ratios (LLRs) of the encoded bits from the same subcarriers.

In broadcast transmissions between nodes of the domain, a source node sends transmissions intended to be received by several other nodes in the domain. Broadcast transmissions may be, for example, control frames intended to be received by all nodes registered in the domain, such as the MAP-A (active media access plan) frames specified in the G.hn standard. In other examples, broadcast transmissions may be control frames intended to be received also by nodes not yet registered in the domain, such as the MAP-D (default media access plan) frames specified in the G.hn standard. In the present description, a broadcast transmission may also refer to a portion of a unicast frame which is intended to be received also by other nodes beside the destination node, for example the header portion of the frame. In broadcast transmission, the operational band of the transmitter might be unknown to the receiver, and vice versa. That is, the operational band of the receiver might also be unknown to the transmitter. For example, Node 2 may wish to transmit a broadcast message, but Node 2 may not be aware of the receive bandwidth of the other nodes in the domain.

According to embodiments of the present invention, a repetition scheme is implemented in the transmitter of a network device to generate encoded payload blocks including copies of the FEC codewords which will allow a destination receiver, receiving the transmission, to detect and decode the transmission without knowing the operational bandwidth of the transmitter.

Figure 4:
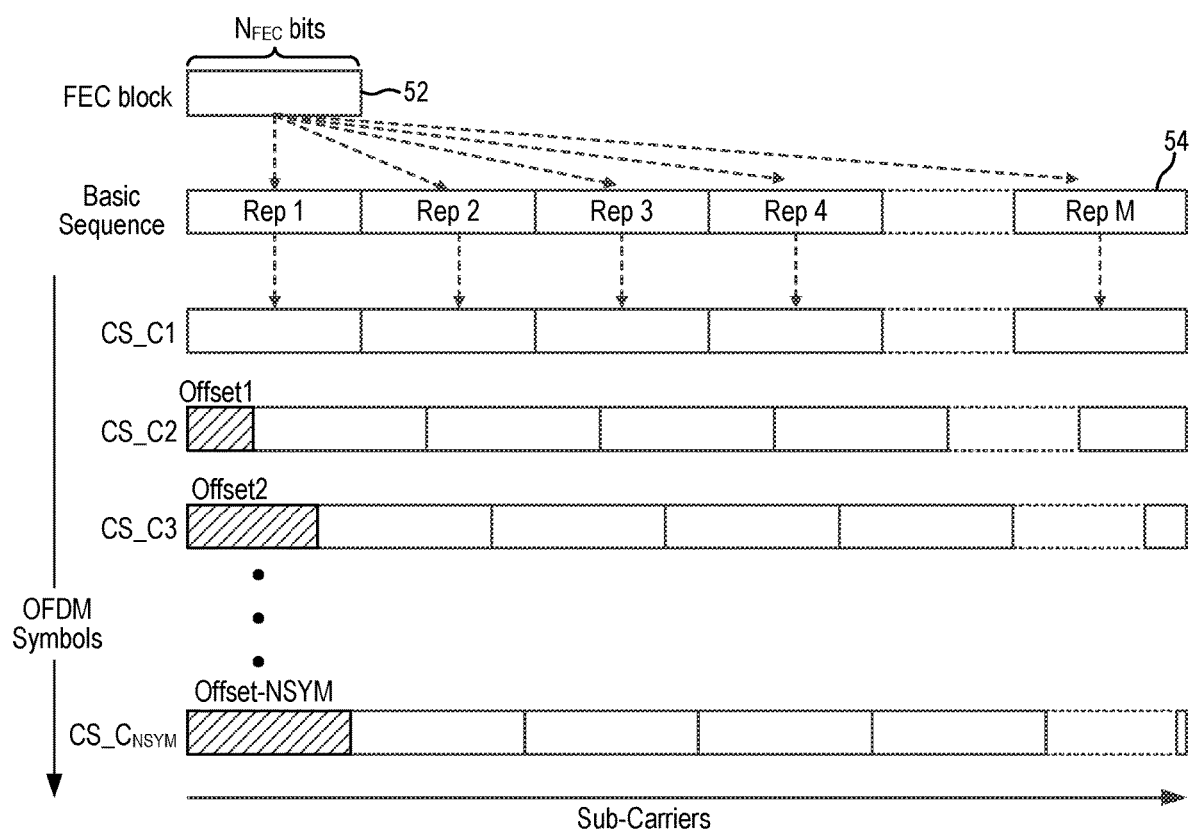
FIG. 4 is a schematic diagram illustrating a codeword repetition method which can be implemented in a transmitter of a network device in embodiments of the present invention.

FIG. 4 is a schematic diagram illustrating a codeword repetition method which can be implemented in a transmitter of a network device in embodiments of the present invention. In one example, the repetition scheme is implemented in the repetition encoder 24 in the transmitter 12 of the network device 10 in FIG. 2. FIG. 4 will be described with reference to FIG. 5 which is a flow chart illustrating a codeword repetition method in embodiments of the present invention.

Figure 5:
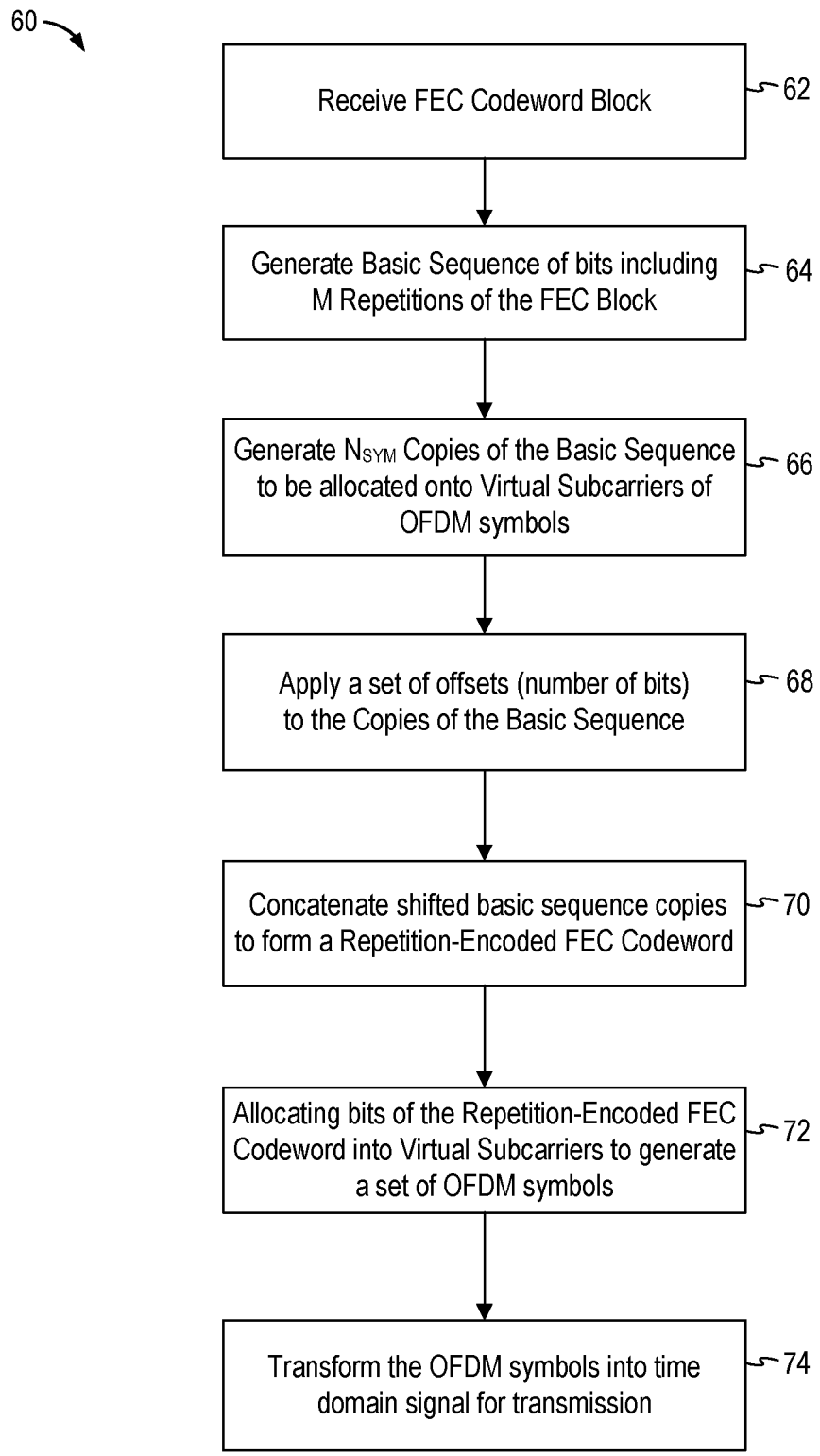
FIG. 5 is a flow chart illustrating a codeword repetition method in embodiments of the present invention.

Referring to FIGS. 4 and 5, the codeword repetition method 60 receives a FEC codeword block 52 having $N_{FEC}$ encoded bits (62). For example, the FEC codeword block 52 can be provided by the FEC encoder 22 in the transmitter 12 of the network device 10 in FIG. 2. At 64, the method 60 generates a basic sequence 54 by replicating the FEC codeword block for M number of times. In FIG. 4, Rep 1 to Rep M represent M repetitions or replicas of the FEC block 52. The M repetitions Rep 1 to Rep M are concatenated to form a sequence of bits as the basic sequence 54. In other words, the basic sequence 54 is a bit sequence containing M repetitions of the FEC codeword.

At 66, the method 60 generates $N_{SYM}$ copies of the basic sequence 54, denoted as copies C1 to $C_{NSYM}$. The copies C1 to $C_{NSYM}$ of the basic sequence 54 are not shown explicitly in FIG. 4. Thus, each copy Ci is itself a sequence of bits or a bit sequence, where i is an index having a value of 1 to NYSM. The copies C1 to $C_{NSYM}$ of the basic sequence 54 are sometimes referred to as basic sequence copies. The bits in the basic sequence copies C1 to $C_{NSYM}$ of the basic sequence 54 are to be allocated into virtual subcarriers of OFDM symbols to form $N_{SYM}$ OFDM symbols, where $N_{SYM}$ is a positive integer of one or more. In the present description, the term "virtual subcarriers" refer to subcarriers associated with the operating frequency band of the domain in which the node or network device is operating, regardless of the actual bandwidth capability of the node or network device. For example, a domain may have a frequency band from 0 to 1200 MHz and a node X may have an actual bandwidth capability of only 300 to 900 MHz. The node X, implementing the codeword repetition method 60 of the present invention will operate to allocate the bits of the copies of the basic sequence into subcarriers of the entire frequency band of 0 to 1200 MHz, even though the node X can only transmit in a limited set of subcarriers. The subcarriers of the entire operating frequency band of the domain are referred herein as the virtual subcarriers.

At 68, the method 60 applies a set of cyclic shifts to the copies of basic sequence, to produce a set of cyclically-shifted bit sequences, denoted as bit sequences CS_C1 to CS_$C_{NSYM}$. The number of bits shifted by the cyclic shift applied to copy i is referred to as offset $y_i$. That is, the method 60 applies an offset of $y_i$ number of bits to each copy Ci of the basic sequence 54, where $y_i$ is a whole number of 0 or more. Accordingly, the allocation of the bits into the virtual subcarriers of OFDM symbol i is performed with an offset of $y_i$ bits. In one embodiment, the offset is applied as a right cyclic shift to each copy Ci of the basic sequence 54. That is, the bit sequence is shifted to the right by the offset bit amount and the bits shifted out of the end of the sequence at the right wrap to the front of the bit sequence to use as the offset bits.

In the embodiment shown in FIG. 4, a right cyclic shift is used. The use of the right cyclic shift is illustrative only and not intended to be limiting. In other embodiments, other methods for shifting the basic sequence by the offset bit amount may be used. In one embodiment, the offset may be applied as left shift of the bit sequence or left cyclic shift. It is instructive to note that a left shift of y bits is equivalent to a right shift of $N_{FEC-y}$ bits, and vice versa, due to the repetitive structure of the basic sequence.

In embodiments of the present invention, each copy Ci is applied with a different amount of offset or different number of offset bits. For example, the copies $C_1$ to $C_{NSYM}$ can be applied with an offset of 0 bits to Y number of bits in increasing manner from copy $C_1$ to copy $C_{NSYM}$. In another example, an offset of $N_{offset}$ bits is applied to the first copy $C_1$ and the number of offset bits increases as multiples of $N_{offset}$ for the remaining copies. Thus, the second copy $C_2$ may be applied with $2 \times N_{offset}$ number of bits, the third copy C3 may be applied with $3 \times N_{offset}$ number of bits, and the last copy $C_{NSYM}$ may be applied with $N_{SYM} \times N_{offset}$ number of bits.

In the example shown in FIG. 4, the offset is applied using a right cyclic shift to each copy of the basic sequence 54. In the present example, the first copy C1 has no offset. Thus, allocation of the bits into the first OFDM symbol associated with copy C1 is performed with no offset, meaning than the n-th bit (or group of bits, depending on the modulation) of the basic sequence is mapped to the n-th virtual subcarrier. Meanwhile, the second copy C2 has an Offset1 of k number of bits. Thus, allocation of the bits into the second OFDM symbol associated with copy C2 is performed with the Offset1 of k number of bits, meaning than the (k+n)-th bit (or group of bits, depending on the modulation order employed by the symbol modulator) of the basic sequence are mapped to the n-th virtual subcarrier, where k is the offset. The remaining OFDM symbols C3 to $C_{NYSM}$ are applied with offsets of Offset2 to Offset-NYSM number of bits, in an increasing fashion. When a cyclic shift is applied, the bit sequence is shifted to the right and the bits shifted out of the sequence are wrapped to the front of the bit sequence as the offset bits.

With the $N_{SYM}$ copies C1 to $C_{NSYM}$ of the basic sequence thus generated with the respective offsets, the method 60 concatenated the cyclically-shifted sequence CS_C1 to CS_$C_{NSYM}$ to form the repetition-encoded FEC codeword (70).

With the repetition-encoded FEC codeword thus generated, the method 60 modulates the repetition-encoded FEC codeword into OFDM symbols by allocating the bits of the repetition-encoded FEC codeword into the virtual subcarriers of the OFDM symbols (72). A set of OFDM symbols corresponding to the cyclically-shifted sequence CS_C1 to CS_$C_{NSYM}$ are thus generated. The set of OFDM symbols can then be transformed into a time domain signal for transmission onto the transmission medium (74).

In practice, the translation of the virtual subcarriers into actual frequencies is performed so that the virtual subcarriers will at least cover the operational frequency band of every potential node of the domain. In one embodiment, the virtual subcarriers cover the entire frequency band of the domain. Accordingly, a transmitter in a domain may transmit a broadcast message even though the transmitter does not know the receive band of all the nodes in the domain. For example, the broadcast message may be sent to invite new nodes to join the domain during a discovery process.

In some embodiments, the parameters of the codeword repetition method, such as the number of OFDM symbols $N_{SYM}$ and the set of offsets to be applied, as well as the other relevant parameters, such as the modulation order and the translation into actual frequencies, are all known to all nodes in the domain that may potentially participate in the broadcast transmission.

In some embodiments, the method 60 may be repeated to generate one or more repetition-encoded FEC codewords, corresponding to one or more FEC codewords generated by the FEC encoder. The one or more repetition-encoded FEC codewords may be concatenated together to form the encoded payload block for transmission onto the medium.

Figure 6:
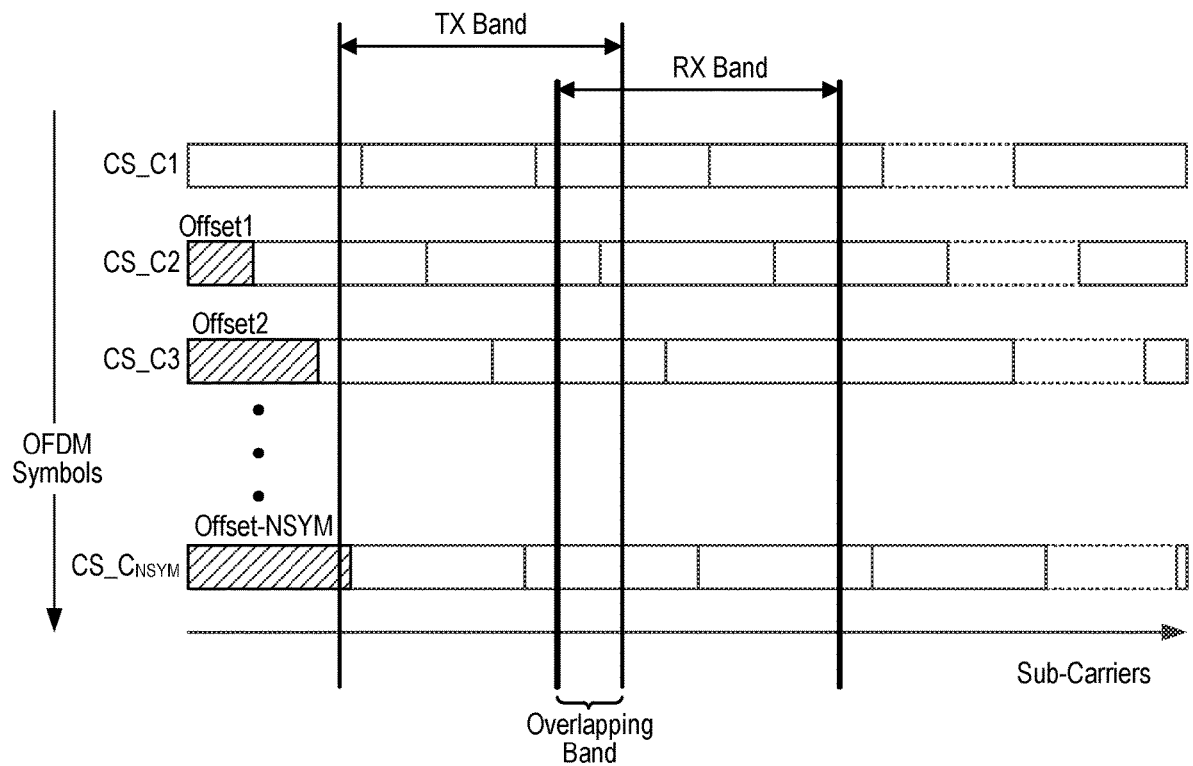
FIG. 6 illustrates the transmit and receive operation of the repetition-encoded FEC codeword in one example.

FIG. 6 illustrates the transmit and receive operation of the repetition-encoded FEC codeword in one example. Referring to FIG. 6, the cyclically-shifted bit sequence CS_C1 to CS_$C_{NYSM}$ are modulated into OFDM symbols for transmission. Although the OFDM symbols are mapped to the virtual subcarriers representing the entire bandwidth of the domain, the transmitter may have a transmit band (TX band) that is only a portion of the domain bandwidth. In the actual transmission, the transmitter transmits only the subcarriers within its transmit band (TX band). Meanwhile, a receiver in the domain receiving the transmission may have a receive band (RX band) being only a portion of the domain bandwidth. In the example shown, the receive band of the receiver overlaps the transmit band of the transmitter. Thus, the receiver can receive the subcarriers in the transmissions that are in the overlapping band. The receiver then demodulates and decodes the received subcarriers to recover the original encoded bit.

More specifically, although the encoded bits of the repetition-encoded FEC codeword are allocated to virtual subcarriers being the entire bandwidth of the domain, the transmitter transmits the bits allocated to the frequencies within the transmitter's operational band (TX band). Meanwhile, the receiver derives the Log-Likelihood Ratios (LLRs) for the bits allocated to frequencies within the receiver's operational band (RX band). Consequently, the receiver is able to derive useful LLRs for the bits allocated to frequencies within the overlapping band of the transmitter and the receiver.

In embodiments of the present invention, the parameters of the codeword repetition method, such as the number of OFDM symbols $N_{SYM}$ and the set of offsets to be applied, are determined so as to ensure that the set of useful LLRs derived by any potential receiver of the transmitted message is sufficient in order to facilitate reliable decoding of the message. Several examples are presented below.

The following description provides examples to further illustrate the codeword repetition scheme of the present invention in actual implementation. The examples presented herein might be utilized for transmission of MAP-A and/or MAP-D control frames of the emerging 2.0 revision of the G.hn standard. However, the examples provided herein are illustrative only and are not intended to be limiting. For example, the parameters utilized for transmission of MAP-A and/or MAP-D control frames of the emerging 2.0 revision of the G.hn standard might be different from those described in the following examples. The examples are presented herein in order to facilitate the explanations of methods and techniques that are applicable to other cases with similar characteristic to the cased discussed in the examples.

MAP-A Example

Figure 7:
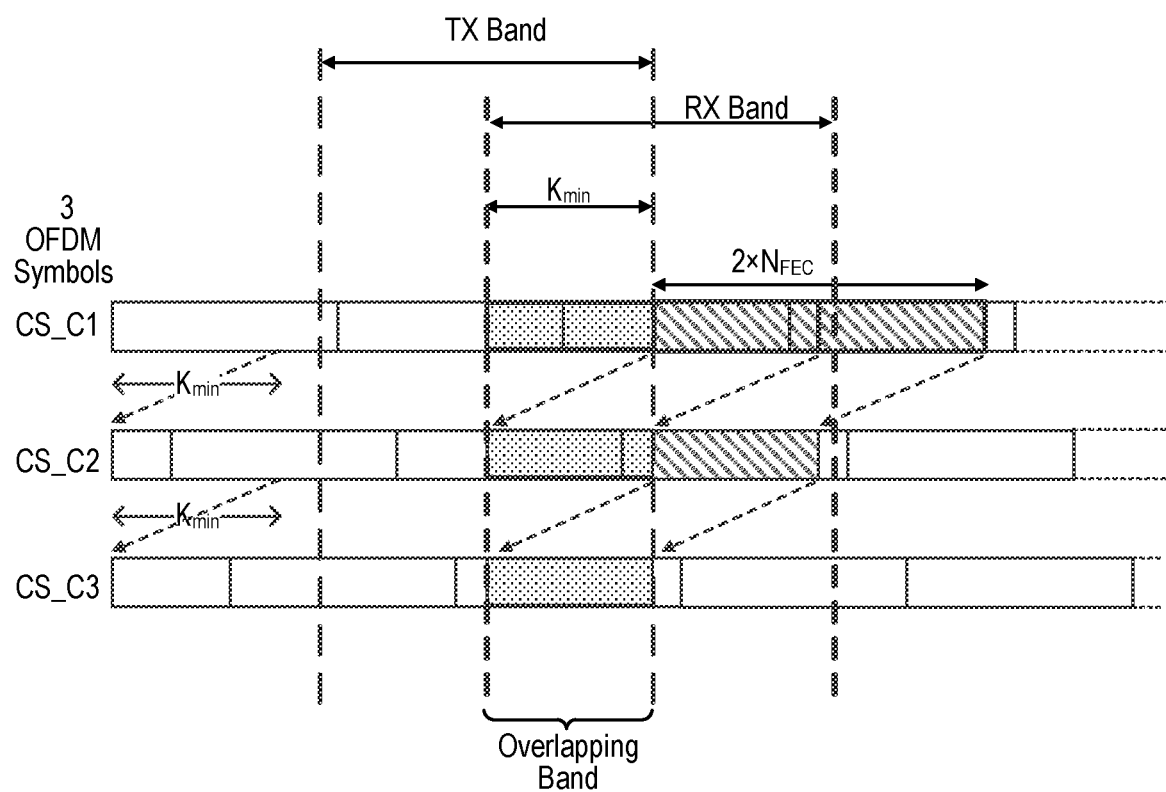
FIG. 7 illustrates a repetition-encoded FEC codeword for an MAP-A control frame of the G.hn standard in some examples.

FIG. 7 illustrates a repetition-encoded FEC codeword for an MAP-A control frame of the G.hn standard in some examples. The MAP-A example shown in FIG. 7 may refer to MAP-A transmissions of the emerging 2.0 revision of the G.hn standard, and may also refer to other control frames with similar conditions.

In MAP-A transmissions, all involved nodes (the transmitter and the potential receivers) are registered to the domain master, and are familiar with the parameters of the domain. Therefore, both the transmitter and the potential receivers are aware of the total operational band of the domain, and of the mask subcarriers (i.e. subcarriers wherein no transmission is allowed). As explained above with reference to FIG. 3, the operational band of the involved nodes may be smaller than the total operational band of the domain, and may differ between nodes. Therefore, the transmitter may be unaware of the operational band of the potential receivers, and the receiver may be unaware of the operational band of the transmitter. However, the domain master is aware of the operational bands of all the nodes, and therefore the domain master can calculate the minimal overlapping bandwidth between any potential transmitter-receiver pair. Furthermore, the domain master may maintain the minimal overlapping band above a desired value, by controlling the admission of new nodes to the domain.

The following notations are applicable to the MAP-A repetition scheme:

$N_{FEC}$—the number of encoded bits per FEC block;

$N_{REP}$—the minimal numbers of received LLRs required for each encoded bit;

BWmin—the number of subcarriers in the minimal overlapping band between any pair of nodes;

Kmin—the number of bits loaded over the minimal overlapping band; and $N_{SYM}$—the number of OFDM symbols over which the FEC block is transmitted. In one example, the modulation scheme utilized for MAP-A transmissions is QPSK, and therefore Kmin=2×BWmin.

The repetition scheme of the present invention and described above with reference to FIGS. 4 and 5 may be a suitable for use for the MAP-A transmissions. In one example, the encoded bits are allocated only to non-masked subcarriers (that is, subcarriers where transmission is allowed). In that case, the parameters BWmin and Kmin denote the number of subcarriers and the number of bits, respectively, in the minimal overlapping band excluding the masked subcarriers. In another example, the encoded bits are allocated to all subcarriers, including the masked subcarriers. In that case, the parameters BWmin and Kmin denote the number of subcarriers and the number of bits, respectively, in the minimal overlapping band including the masked subcarriers.

The number of OFDM symbols is given by:

$$N_{SYM} = \text{ceiling}\left(\frac{N_{FEC} \cdot N_{REP}}{K_{min}}\right),$$

where the function ceiling(x) is the lowest integer greater or equal to x, and Kmin is the number of bits loaded over the minimal overlapping band. In the present example, the offset used to shift the bit sequence is Kmin or some number lower than Kmin.

Figure 8:
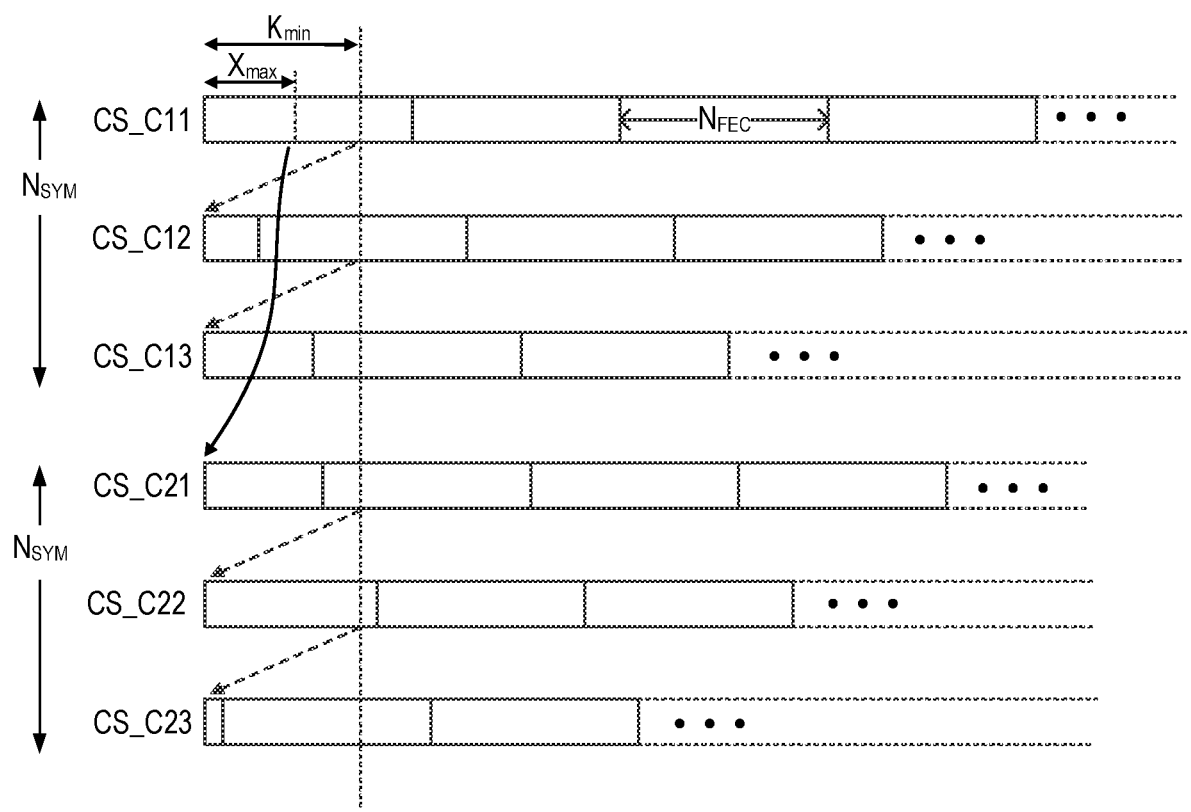
FIG. 8 illustrates a repetition-encoded FEC codeword for an MAP-D control frame of the G.hn standard in some examples.
Figure 9:
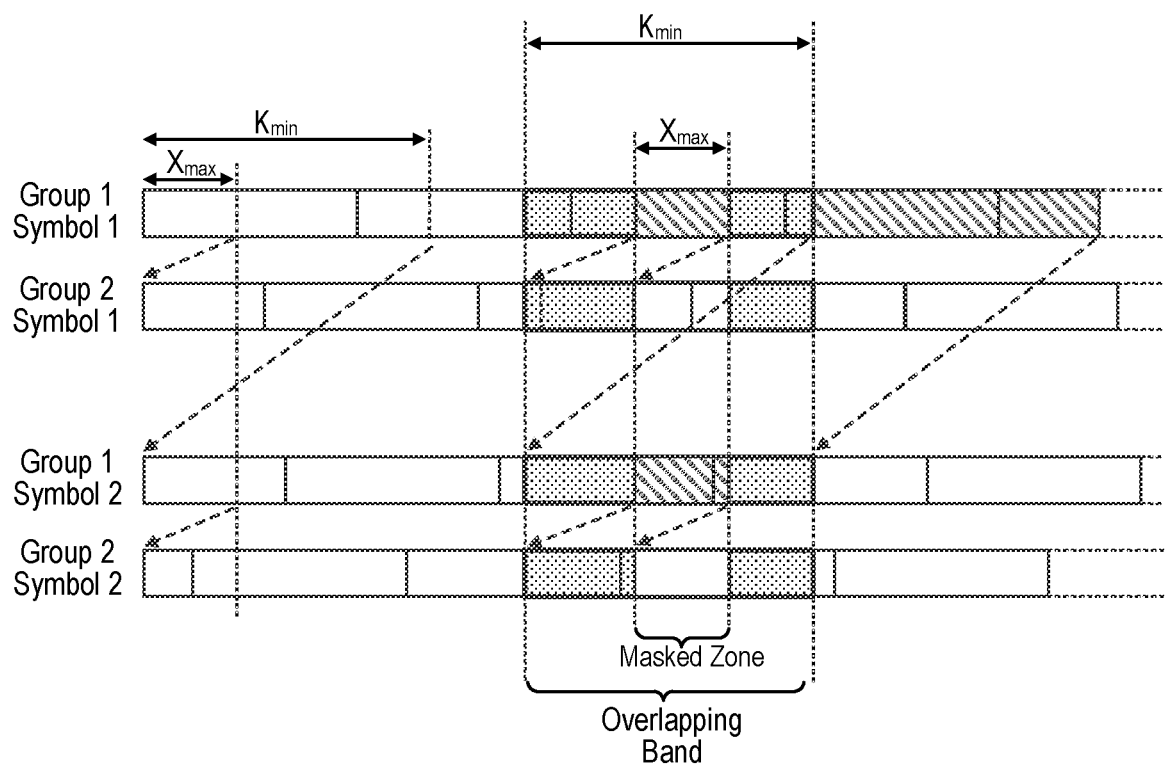
FIG. 9 illustrates a repetition-encoded FEC codeword for an MAP-D control frame of the G.hn standard in some examples.

FIG. 7 illustrates an example of the repetition scheme for MAP-A, for the case that $N_{REP}=2$ and $2 \times Kmin < 2 \times N_{FEC} \leq 3 \times Kmin$, and therefore $N_{SYM}=3$. It is noted that the examples presented in FIGS. 7, 8, and 9 are illustrated with left shift, rather than the right shift illustrated in FIGS. 4 and 6. It is also noted that, as explained above, right and left shifts are equivalent, with appropriate adjustment of the offset value, due to the repetitive structure of the basic sequences.

FIG. 7 illustrates a worst-case condition when the overlapping width of the overlapping band is BWmin, and therefore the number of the LLRs derived from each OFDM symbol is only Kmin. In the example shown in FIG. 7, the offset between successive OFDM symbols is Kmin. That is, the first offset for copy C1 is 0, the second offset for copy C2 is Kmin, and the third offset for copy C3 is 2*Kmin, and so on. The cyclically-shifted bit sequences CS_C1 to CS_C3 are shown in FIG. 7. However, since the offset is also Kmin, the LLRs derived from each OFDM symbol refer to different locations within the basic sequence and the receiver derives sufficient LLR values for each encoded bit.

In the case where the encoded bits are allocated only to non-masked subcarriers, all LLRs are derived from non-masked subcarriers and can be utilized for decoding. In the case where the encoded bits are allocated to all subcarriers, including the masked subcarriers, some of the LLRs may be derived from masked subcarriers and are not utilized for decoding. For example, the masked subcarriers may be considered as erasures. However, such erasures may be handled by the erasure correction capabilities of the coding structure composed of the FEC and the repetition scheme.

MAP-D Example

FIG. 8 illustrates a repetition-encoded FEC codeword for an MAP-D control frame of the G.hn standard in some examples. The MAP-D example shown in FIG. 8 may refer to MAP-D transmissions of the emerging 2.0 revision of the G.hn standard, and may also refer to other control frames with similar conditions.

In MAP-D transmissions, some of the involved nodes may be not registered to the domain master, and those nodes are thus not familiar with the parameters of the domain. Therefore, some of the transmitter and/or the potential receivers may be not aware of the total operational band of the domain, and of the masked subcarriers (that is, subcarriers wherein no transmission is allowed). Furthermore, as explained above with reference to FIG. 3, the operational band may differ between nodes. Therefore, the transmitter may be unaware of the operational band of the potential receivers, and the receiver may be unaware of the operational band of the transmitter. However, there is assumed to be a lower bound on the potential overlapping band between any two nodes whose operational band is not totally disjoined, and there is assumed to be an upper bound for the number of subcarriers within any masked zone.

Beside the notations introduced above with reference to the MAP-A repetition scheme, the following notations are also applicable to the MAP-D repetition scheme:

X_BWmax—the number of subcarriers in a maximal masked zone; and

Xmax—the number of bits loaded over a maximal masked zone. Note that the modulation scheme utilized for MAP-D transmissions is QPSK, and therefore Xmax=2×X_BWmax.

FIG. 8 illustrates a repetition scheme that can be used for the MAP-D transmissions. The repetition scheme is based on the codeword repetition scheme described above with reference to FIGS. 4 and 5. In the present example, the encoded bits are allocated to all subcarriers, whether masked or not. Two groups of OFDM symbols are utilized for allocating the bits of the basic sequence. The cyclically-shifted bit sequences CS_C11 to CS_C13 and CS_C21 to CS_C23 correspond to the respective OFDM symbols. The number of OFDM symbols within any group is given as:

$$N_{SYM} = \text{ceiling}\left(\frac{N_{FEC} \cdot N_{REP}}{K_{min}}\right),$$

wherein the function ceiling(x) is the lowest integer greater or equal to x, and Kmin is the number of bits loaded over the minimal overlapping band. In the present example, the offset used to shift the bit sequence within each group is Kmin or some number lower than Kmin. The offset between the two groups is Xmax.

FIG. 9 illustrates a repetition-encoded FEC codeword for an MAP-D control frame of the G.hn standard in some examples. FIG. 9 illustrates an example of applying the repetition scheme illustrated in FIG. 8 for the case that $N_{REP}=2$ and $N_{FEC} < 2 \times K_{min} \leq 2 \times N_{FEC}$, and therefore $N_{SYM}=2$. FIG. 9 illustrates a worst-case condition when the overlapping width of the overlapping band is BWmin, and the width of the masked zone within the overlapping band is X_BWmax. For the sake of the explanation, the two groups are presented interleaved within each other, so that the bit sequence for symbol 1 of group 2 is illustrated next to the bit sequence for symbol 1 of group 1. It is noted that the order in which the OFDM symbols are presented in the Figures is not necessarily the order in which they are transmitted. It is further noted that the order in which the OFDM symbols are transmitted (and received) is not material to the repetition scheme, as long as sufficient LLR values are derived by the receiver.

FIG. 9 illustrates that since the offset between the groups is Xmax, the LLR values not received in symbol n of group 1 are received in symbol n of group 2, and therefore those two symbols together provide at least Kmin LLR values. Following the same analysis as in reference to FIG. 7, it is evident that all symbols of both groups together provide all the required LLR values.

In alternate examples, the MAP-D repetition scheme might be utilized with one group rather than with two groups, such being similar to the repetition scheme described above where the encoded bits are allocated to all subcarriers, including the masked subcarriers. In that cases, some of the LLRs of the basic sequence are derived from subcarriers carrying no signal. However, in some cases this deficiency may be handled by the error correction capability of the super-code composed of the FEC and the repetition scheme.

The above detailed descriptions are provided to illustrate specific embodiments of the present invention and are not intended to be limiting. Numerous modifications and variations within the scope of the present invention are possible. The present invention is defined by the appended claims.

What is claimed is:

1. A network device including a transmitter and a receiver, the transmitter comprising:
   a forward error correction (FEC) encoder generating one or more FEC codewords corresponding to payload data frames indicative of data to be transmitted, each FEC codeword having a first number of encoded bits; and
   a repetition encoder receiving the one or more FEC codewords and generating a repetition-encoded FEC codeword for each of the one or more FEC codewords, each repetition-encoded FEC codeword comprising a set of bit sequences concatenated together, each bit sequence corresponding to an orthogonal frequency-division multiplexing (OFDM) symbol such that each repetition-encoded FEC codeword comprises the set of bit sequences corresponding to a set of OFDM symbols, the repetition encoder generating a first repetition-encoded FEC codeword for a first FEC codeword by:
   replicating the first FEC codeword M times to form a basic bit sequence being M replicas of the first FEC codeword;
   providing N copies of the basic bit sequence as the set of bit sequences;
   applying an offset to shift each bit sequence; and
   concatenating the set of bit sequences to form the set of OFDM symbols as the first repetition-encoded FEC codeword,
   wherein the offset applied to each bit sequence is different from the offset applied to the other bit sequences and the offsets applied to the set of bit sequences form a set of offsets, the repetition encoder allocating each offset-shifted bit sequence into subcarriers over a frequency range indicative of an operating frequency band of a domain to form a corresponding OFDM symbol of the set of OFDM symbols.

2. The network device of claim 1, wherein the transmitter further comprises:
   a symbol modulator receiving the repetition-encoded FEC codeword from the repetition encoder and mapping encoded bits in the repetition-encoded FEC codeword into complex symbols;
   an OFDM modulator receiving the complex symbols from the symbol modulator and arranging the complex symbols into frequency domain OFDM symbols by allocating the complex symbols into subcarriers of OFDM symbols over the frequency range indicative of the operating frequency band of the domain, the OFDM modulator further transforming the frequency domain OFDM symbols into time domain OFDM symbols; and
   a transmitter front-end receiving the time domain OFDM symbols from the OFDM modulator and concatenating the time domain OFDM symbols into a continuous time domain signal and transmitting the time domain signal onto a communication medium.

3. The network device of claim 2, wherein the transmitter has a transmit frequency band being a portion of the operating frequency band of the domain, and the transmitter front-end transmits the time domain signal associated with subcarriers in the transmit frequency band of the transmitter.

4. The network device of claim 1, wherein each offset in the set of offsets comprises y number of offset bits, y being a whole number of 0 or more.

5. The network device of claim 4, wherein the set of offsets comprises offset bit values that are increasing for a first bit sequence to a last bit sequence in the set of bit sequences.

6. The network device of claim 4, wherein the set of offsets comprises a first offset having a first offset bit value, and remaining offsets in the set of offsets comprise multiples of the first offset bit value.

7. The network device of claim 1, wherein the repetition encoder applies the offset to shift each bit sequence by using a right cyclic shift.

8. A method for transmitting a message comprising a repetition-encoded forward error correction (FEC) codeword, the method comprising:
receiving a FEC codeword having a first number of encoded bits;
applying a repetition-encoding scheme to the FEC codeword to generate a repetition-encoded FEC codeword, wherein the repetition-encoded FEC codeword comprises a set of bit sequences concatenated together, the set of bit sequences corresponding to a set of orthogonal frequency-division multiplexing (OFDM) symbols, each bit sequence being formed by M replicas of the FEC codeword and an offset applied to shift the bit sequence, wherein the offset applied to each bit sequence is different from the offset applied to the other bit sequences and the offsets applied to the set of bit sequences form a set of offsets, each offset-shifted bit sequence to be allocated to subcarriers over a frequency range indicative of an operating frequency band of a domain to form a corresponding OFDM symbol of the set of OFDM symbols;
modulating the set of bit sequences of the repetition-encoded FEC codeword into the set of OFDM symbols by allocating encoded bits of the bit sequences into subcarriers of the OFDM symbols over the frequency range indicative of the operating frequency band of the domain; and
transmitting a time domain signal representing the set of OFDM symbols corresponding to the repetition encoded FEC codeword over a communication media.

9. The method of claim 8, wherein applying the repetition-encoding scheme to the FEC codeword to generate a repetition-encoded FEC codeword comprises:
replicating the FEC codeword to generate a basic bit sequence comprising M replicas of the FEC codeword;
providing N copies of the basic bit sequence as the set of bit sequences, each copy being associated with an OFDM symbol;
applying the respective offset to each copy of the basic bit sequence to shift the bit sequence, the offset being different for each copy of the basic bit sequence; and
concatenating the N shifted copies of the basic bit sequence to form the repetition-encoded FEC codeword.

10. The method of claim 8, further comprising:
transmitting the time domain signal representing the set of OFDM symbols associated with subcarriers in a transmit frequency band of a transmitter, the transmit frequency band being a portion of the operating frequency band of the domain.

11. The method of claim 9, wherein applying the offset to each copy of the basic bit sequence to shift the bit sequence comprises:
applying the offset to each copy of the basic bit sequence where the offset comprises y number of offset bits, y being a whole number of 0 or more.

12. The method of claim 11, wherein applying the offset to each copy of the basic bit sequence to shift the bit sequence comprises:
applying offset bit values that are increasing for a first copy of the basic bit sequence to a last copy of the basic bit sequence in the set of bit sequences.

13. The method of claim 11, wherein applying the offset to each copy of the basic bit sequence to shift the bit sequence comprises:
applying a first offset bit value to a first copy of the basic bit sequence and applying multiples of the first offset bit value to remaining copies of the basic bit sequences.

14. The method of claim 8, wherein applying the offset to each copy of the basic bit sequence to shift the bit sequence comprises:
applying the offset to each copy of the basic bit sequence using a right cyclic shift.

15. A method for transmitting a message comprising a repetition-encoded FEC codeword, the method comprising:
receiving a forward error correction (FEC) codeword having a first number of encoded bits;
generating a repetition-encoded FEC codeword based on the FEC codeword;
modulating the repetition-encoded FEC codeword into a set of OFDM symbols; and
transmitting a time domain signal representing the set of OFDM symbols corresponding to the repetition encoded FEC codeword over a communication media,
wherein the repetition-encoded FEC codeword is the same as a second repetition-encoded FEC codeword generated by applying a repetition-encoding scheme to the FEC codeword, and
wherein applying the repetition-encoding scheme to the FEC codeword to generate the second repetition-encoded FEC codeword comprises:
replicating the FEC codeword to generate a basic bit sequence comprising M replicas of the FEC codeword;
providing N copies of the basic bit sequence as a set of bit sequences, each copy being associated with an OFDM symbol;
applying an offset to each copy of the basic bit sequence to shift a bit sequence, the offset being different for each copy of the basic bit sequence; and
concatenating the N shifted copies of the basic bit sequence to form the repetition-encoded FEC codeword.

16. The method of claim 15, further comprising:
transmitting the time domain signal representing the set of OFDM symbols associated with subcarriers in a transmit frequency band of a transmitter, the transmit frequency band being a portion of an operating frequency band of a domain.

17. The method of claim 15, wherein applying the offset to each copy of the basic bit sequence to shift the bit sequence comprises:
applying the offset to each copy of the basic bit sequence where the offset comprises y number of offset bits, y being a whole number of 0 or more.

18. The method of claim 17, wherein applying the offset to each copy of the basic bit sequence to shift the bit sequence comprises:
applying offset bit values that are increasing for a first copy of the basic bit sequence to a last copy of the basic bit sequence in the set of bit sequences.

19. The method of claim 17, wherein applying the offset to each copy of the basic bit sequence to shift the bit sequence comprises:
applying a first offset bit value to a first copy of the basic bit sequence and applying multiples of the first offset bit value to remaining copies of the basic bit sequences.

20. The method of claim 15, wherein applying the offset to each copy of the basic bit sequence to shift the bit sequence comprises:
    applying the offset to each copy of the basic bit sequence using a right cyclic shift.

* * * * *